(12) United States Patent
Jarrar et al.

(10) Patent No.: US 8,710,906 B1
(45) Date of Patent: Apr. 29, 2014

(54) FINE GRAIN VOLTAGE SCALING OF BACK BIASING

(71) Applicant: Freescale Semiconductor, Inc., Austin, TX (US)

(72) Inventors: Anis M. Jarrar, Austin, TX (US); Stefano Pietri, Austin, TX (US); Steven K. Watkins, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/764,946

(22) Filed: Feb. 12, 2013

(51) Int. Cl.
*H03K 3/01* (2006.01)
(52) U.S. Cl.
USPC ........................................ 327/534; 327/537
(58) Field of Classification Search
USPC ......... 327/534, 536, 537, 530, 538, 540, 544; 257/901
See application file for complete search history.

(56) References Cited

U.S. PATENT DOCUMENTS

| | | | | |
|---|---|---|---|---|
| 4,791,316 A | * | 12/1988 | Winnerl et al. | ............... 327/545 |
| 6,232,827 B1 | * | 5/2001 | De et al. | ........................ 327/537 |
| 2007/0300201 A1 | | 12/2007 | Matsumoto et al. | |
| 2008/0307240 A1 | | 12/2008 | Dahan et al. | |
| 2012/0043812 A1 | | 2/2012 | Hoberman et al. | |
| 2012/0327725 A1 | * | 12/2012 | Clark et al. | ............ 365/189.011 |

* cited by examiner

*Primary Examiner* — Lincoln Donovan
*Assistant Examiner* — Jung H Kim
(74) *Attorney, Agent, or Firm* — Gary Stanford

(57) ABSTRACT

An integrated circuit including a substrate, multiple devices, and voltage control devices. The devices may include high threshold, low threshold, and standard threshold voltage devices. The devices and the voltage control devices are distributed across and coupled to the same substrate. Each voltage control device is configured to apply a back bias voltage at one of multiple discrete offset voltage levels. At least one voltage control device applies a first offset voltage level for back biasing high threshold voltage devices and at least one voltage control device applies a second offset voltage level for back biasing low threshold voltage devices. The selection of back biasing is based on relative population density of the different types of devices and varies across the substrate. Fine grain reverse back biasing reduces leakage current while reducing any performance decrease. Fine grain forward back biasing improves performance while reducing any leakage current increase.

13 Claims, 10 Drawing Sheets

| DEVICE | VT(mV) | SPEED | LEAKAGE | PERFORMANCE DECREASE WITH RBB | LEAKAGE REDUCTION WITH RBB | RELATIVE RBB | RBB OFFSET VOLTAGE LEVEL (mV) |
|---|---|---|---|---|---|---|---|
| HVT | 480 | L | L | H | L | L | 100 |
| SVT | 350 | M | M | M | M | M | 200 |
| LVT | 280 | H | H | L | H | H | 300 |

200

| DEVICE | VT(mV) | SPEED | LEAKAGE | PERFORMANCE INCREASE WITH FBB | LEAKAGE REDUCTION WITH RBB | RELATIVE RBB | RBB OFFSET VOLTAGE LEVEL (mV) |
|---|---|---|---|---|---|---|---|
| HVT | 480 | L | L | H | L | H | 300 |
| SVT | 350 | M | M | M | M | M | 200 |
| LVT | 280 | H | H | L | H | L | 100 |

700

801

FINE GRAIN VOLTAGE SCALING OF BACK BIASING

BACKGROUND OF THE INVENTION

1. Field of the Invention

The present invention relates generally to back biasing of systems on a chip, and more particularly to fine grain voltage scaling of back biasing with voltage control devices distributed across a common substrate of distributed devices.

2. Description of the Related Art

Low power consumption is emerging as a significant feature for electronic devices, particularly handheld and/or battery powered applications. Significant reductions in leakage and power consumption can be obtained by reverse back biasing transistor devices of the circuitry of the electronic device. Reverse back biasing (RBB) generally involves driving a voltage differential between the bulk (or body) connection and source terminal of the device to increase its threshold voltage (VT). In a standard complementary metal-oxide semiconductor (CMOS) configuration, the source and substrate of P-channel MOS (PMOS) devices are both tied to VDD and the source and substrate of N-channel MOS (NMOS) devices are both tied to VSS. In one conventional reverse back biased CMOS configuration, the body connections of PMOS devices are instead pulled to a voltage above VDD and the body connections of NMOS devices are instead pulled to a voltage below VSS. A negative charge pump or the like may be used to drive the substrate of NMOS devices to a negative voltage level below VSS. VSS is assumed to be zero (0) Volts (V) or ground, where it is understood that VSS may be any other positive or negative voltage level establishing a reference supply voltage level.

RBB has been a very effective technique for certain semiconductor process technologies, including 130 nanometer (nm) and 90 nm designs. RBB has become more problematic and less popular with the more advanced process technologies including 65 nm and below, such as including 65 nm, 55 nm, 40 nm, 28 nm, etc. In general, for most process technologies including the more advanced process technologies, RBB may result in a relatively high leakage reduction of low threshold voltage (LVT) devices with relative low performance impact, and may result in a significant leakage reduction of standard threshold voltage (SVT) devices without substantial performance impact. LVT and SVT devices are generally faster with higher performance but are also more leaky than high threshold voltage (HVT) devices. HVT devices are typically used in areas in which lower performance is needed. RBB has less impact on performance with greater impact on leakage reduction for LVT and even SVT devices, yet has caused a significant performance decrease of the lower leakage HVT devices, particularly for the more advanced process technologies.

Since the application of a uniform level of RBB on HVT, SVT and LVT devices can cause an unacceptable performance impact on the HVT devices, one solution has been to replace HVT devices with either SVT or LVT devices. Such substitution, however, defeats the very purpose of leakage and power reduction. Another solution has been to isolate the LVT and SVT devices from the HVT devices into separate and isolated substrate domains. Such isolation techniques, however, may cause a significant level of inconvenient location re-design, and require a significant increase in overhead by adding guard rings or the like to establish and ensure domain isolation. The use of RBB, therefore, has become more limited with the more advanced process technologies at 65 nm and below because of its performance impact.

Back biasing may be performed in the forward direction, which is referred to as forward back biasing (FBB), to improve performance at the cost of increased leakage and power consumption. FBB involves driving a voltage differential between the bulk (or body) connection and source terminal of the device in the opposite direction of RBB relative to the supply voltages to decrease its threshold voltage (VT). FBB also has an opposite effect as that of RBB, in which the transistor device becomes faster at the cost of increased leakage and power consumption. The application of a uniform level of FBB on HVT, SVT and LVT devices also causes a significant performance impact on the HVT devices as compared to the SVT and LVT devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventors have recognized the benefits of RBB and FBB but have also noted the performance decrease of certain device types, such as high threshold voltage (HVT) devices, with the application of back biasing. They have therefore developed fine grain voltage scaling of back biasing as described herein to apply RBB and FBB in such a manner to reduce leakage and/or improve performance while also reducing any performance decrease.

Figures 1, 2:
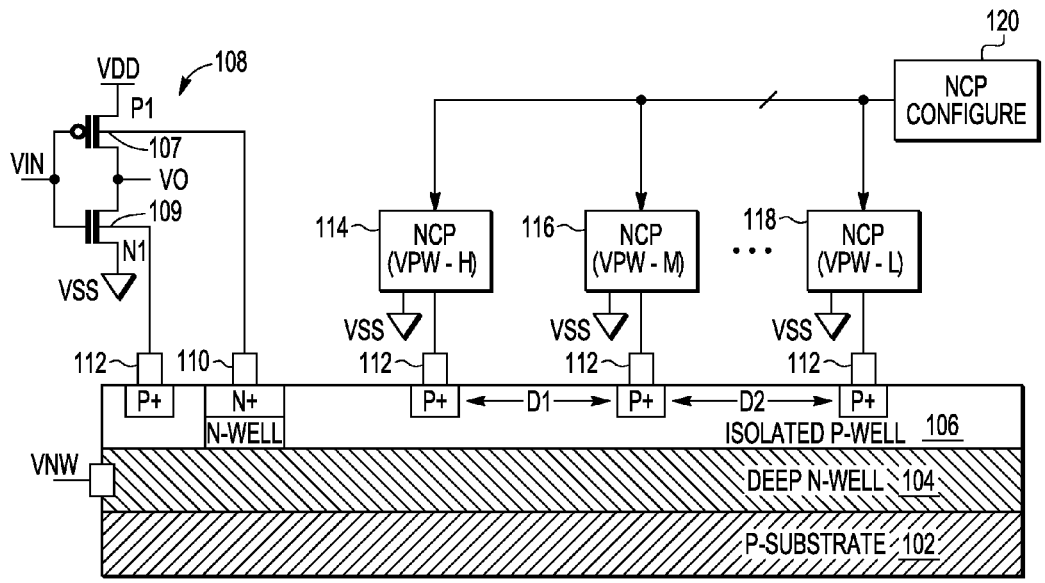
FIG. 1 is a simplified schematic and figurative diagram illustrating a physical substrate configuration, which may include multiple substrate layers, logic devices such as logic gates and the like, substrate well ties, and programmable negative charge pumps (NCPs) distributed along the substrate for applying reverse back biasing (RBB)
FIG. 2 is a table listing the corresponding VT, relative characteristics, and possible RBB offset voltage level of each of the different device types HVT, SVT and LVT, respectively.

FIG. 1 is a simplified schematic and figurative diagram illustrating a physical substrate configuration 101, which may include multiple substrate layers, logic devices such as logic gates and the like, substrate well ties, and programmable negative charge pumps (NCPs) distributed along the substrate for applying reverse back biasing (RBB). The substrate configuration 101 includes an underlying P-substrate layer 102, a deep N-well substrate layer 104, and an isolated P-well substrate layer 106, in which the deep N-well substrate layer 104 is shown sandwiched between the layers 102 and 106. A schematic depiction of an inverter 108 is shown which is integrated onto the substrate configuration 101. The inverter 108 is configured as a CMOS inverter and generally represents any type of logic gate which may be implemented.

The illustrated inverter 108 includes a PMOS transistor P1 having a source coupled to a source voltage VDD, a drain coupled to a drain of an NMOS transistor N1, and a gate forming an input node VIN. N1 has its source coupled to a reference source voltage VSS, its gate coupled to the gate of P1 at VIN, and its drain coupled to the drain of P1 at an output node V0. P1 has a body connection 107 electrically coupled to the deep N-well substrate layer 104 via a corresponding well tie 110. The well tie 110 includes N+ and N-well portions formed within the P-well substrate layer 106 for connecting the bulk connection 107 of P1 to the deep N-well substrate layer 104. Similarly, N1 has a body connection 109 electrically coupled to the P-well substrate layer 106 via a corresponding well tie 112. The well tie 112 includes a P+ portion formed within the P-well substrate layer 106 for connecting the bulk connection 109 of N1 to the P-well substrate layer 106. Although not shown, the inverter 108 represents many different types of gates and devices formed on or within the substrate configuration 101 and coupled in similar manner.

The deep N-well substrate layer 104 is charged to a VNW bias voltage level which is greater than VDD for RBB. RBB application of the bulk connection 107 of P1 changes the threshold voltage (VT) of the device which correspondingly reduces current leakage of P1 and other P-type devices similarly coupled to the deep N-well substrate layer 104. VNW may be developed by voltage control devices (not shown) charging the voltage of VDD to a higher bias voltage level, such as by voltage regulators or the like which step up or down voltage from another voltage source (not shown). The deep N-well substrate layer 104 is highly resistive so that many such regulator devices may be distributed across the area covered by the deep N-well substrate layer 104. The increase in overhead for providing such regulators is offset by the reduction of leakage current and corresponding reduction in power consumption. It is noted that fine grain voltage scaling of back biasing is illustrated with respect to back biasing of the P-well substrate layer, such as layer 106, where it is understood that the concepts are equally applicable to the N-well substrate layer, such as the deep N-well substrate layer 104.

The P-well substrate layer 106 is charged to a VPW bias voltage level which is less than VSS for RBB. RBB of the bulk connection 109 of N1 reduces current leakage of N1 and other N-type devices similarly coupled to the P-well substrate layer 106. In this case, VPW is developed by multiple voltage control devices, such as configurable or programmable negative charge pumps (NCPs) 114, 116, . . . , 118 distributed across the area of the P-well substrate layer 106 as further described herein. Each NCP 114-118 is electrically connected to the P-well substrate layer 106 via a corresponding one of multiple well ties 112 distributed across the P-well substrate layer 106. Each NCP 114-118 is also coupled to VSS and programs an offset voltage relative to VSS.

The P-well substrate layer 106 is also highly resistive so that multiple NCPs 114-118 are used to perform RBB to develop the VPW bias voltage level. The NCPs 114-118 may be distributed to charge the P-well substrate layer 106 to the same voltage level. RBB results in a relatively high leakage reduction of LVT devices with relative low performance impact, and may result in a significant leakage reduction of SVT devices without substantial performance impact. In the more advanced process technologies including 65 nm and below, such as including 65 nm, 55 nm, 40 nm, 28 nm, etc., such uniformly distributed RBB causes undesirable side effects and a performance decrease of lower leakage HVT devices.

Instead of using static NCPs or programming them to the same voltage level, each of the NCPs 114-118 are programmed to one of multiple discrete offset voltage levels based on the distribution of device types within the locale of each NCP as further described herein. As illustrated in FIG. 1, the NCP 114 is programmed with a VPW at a high (H) RBB offset voltage level most suitable for LVT devices, the NCP 116 is programmed with a VPW at a medium (M) RBB offset voltage level most suitable for SVT devices, and the NCP 118 is programmed with a VPW at a low (L) RBB offset voltage level most suitable for HVT devices. The NCP 114 is separated from the NCP 116 by a distance D1 and the NCP 116 is separated from the NCP 118 by a distance D2. As described further herein, the distances D1 and D2 are determined according to a differential bias spacing which is a variable based on a relative level of RBB voltage distribution resolution to be achieved. The RBB current capacity of each NCP depends on its corresponding size as further described herein, in which size is primarily measured in terms of its current drive capacity.

An NCP configuration block 120 is shown for programming each of the NCPs 114-118 to a selected one of the multiple discrete offset voltage levels. The NCP configuration block 120 may be configured in any suitable manner, such as a non-volatile memory device storing programmed values each corresponding to one of the discrete offset voltage levels. In another embodiment, the NCP configuration block 120 includes multiple fuses which are blown during fabrication to set the discrete offset voltage level for each of the NCPs 114-118. A fuse configuration is a static configuration in which the NCPs 114-118 are generally not further programmed during operation.

Figure 12:
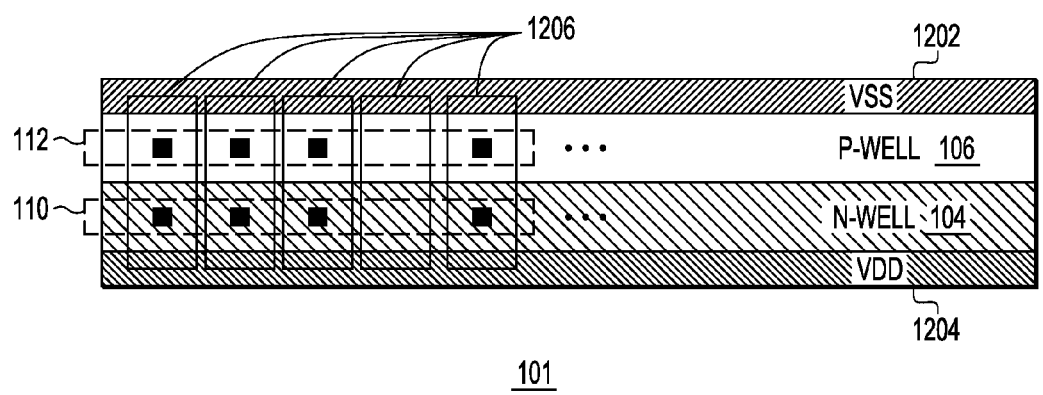
FIG. 12 is a simplified diagram of a side view of the physical substrate configuration of FIG. 1 illustrating CMOS devices distributed along the substrate layers.

FIG. 12 is a simplified diagram of a side view of the physical substrate configuration 101 illustrating CMOS devices 1206 distributed along the P-well substrate layer 106 and the deep N-well substrate layer 104. The substrate configuration 101 shows additional supply voltage layers including a VSS later 1202 and a VDD layer 1204. The CMOS devices 1206 are coupled between VDD and VSS and each represents a device or logic gate configuration, such as, for example, inverters, AND gates, OR gates, NAND gates, NOR gates, etc. Although many devices may not include bulk connections to the substrate layers 104 and 106, many of the CMOS devices 1206 include a well tie 110 for electrically coupling a corresponding body connection of the CMOS device 1206 to the deep N-well substrate layer 104 and a well tie 112 for electrically coupling a corresponding body connection of the CMOS device 1206 to the P-well substrate layer 106. Although the devices are illustrated in a uniform manner, it is understood that the devices may vary considerably in width, length and relative current drive capacity. Also, each of the CMOS devices 1206 may be configured according to any one of the different device types HVT, SVT and LVT.

FIG. 2 is a table 200 listing the corresponding VT, relative characteristics, and possible RBB offset voltage level of each of the different device types HVT, SVT and LVT, respectively. The characteristics include relative speed, relative amount of leakage, relative performance decrease with RBB, relative leakage reduction with application of RBB, and relative RBB level to be applied. The relative RBB level is selected to optimize performance and leakage reduction as further described herein. The RBB offset voltage level corresponds with the relative RBB level and is an offset voltage relative to the voltage level of VSS, which is the voltage level of the source terminals of the devices. The VT values and RBB offset voltage level are listed in millivolts (mV), and the relative characteristics are each listed as one of low (L), medium (M) and high (H). The VT values for the HVT, SVT and LVT devices are approximately 480 mV, 350 mV, and 280 mV, respectively, as indicated by the corresponding device type nomenclature. The relative speed of the HVT, SVT and LVT devices are L, M and H, respectively, in which the HVT devices are the slowest with the lowest performance level, whereas the LVT devices are the fastest with the highest performance level. It is noted that although the SVT devices have M values for each of the relative characteristics, the SVT devices tend to be more similar to the LVT devices rather than the HVT devices.

The relative leakage of the HVT, SVT and LVT devices are L, M and H, respectively, in which the HVT devices have the lowest leakage whereas the LVT devices have the highest leakage. The relative performance decrease of the HVT, SVT and LVT devices are H, M and L, respectively, in which the HVT devices experience the highest level of performance decrease with application of RBB, whereas the LVT devices experience the lowest level of performance decrease with application of RBB. The relative amount of leakage reduction of the HVT, SVT and LVT devices with application of RBB are L, M and H, respectively, in which the HVT devices experience the lowest level of leakage reduction with application of RBB, whereas the LVT devices experience the highest level of leakage reduction with application of RBB. The relative RBB level to be applied to the HVT, SVT and LVT devices are therefore L, M and H, respectively, in order to reduce leakage without significantly reducing performance.

Table 200 illustrates that the LVT devices are ideally suited for that application of relatively high RBB since they have the lowest decrease of performance with the highest level of leakage reduction. The actual amount of performance decrease and leakage reduction may vary depending upon certain device parameters, including size and relative values of width and length and the like, but in general the performance decrease is on the order of about 5% with a significant level of leakage reduction. In many cases, a 5% performance decrease is tolerable and the substantial power savings is worth the trade-off in performance. Generally, it is desired to apply the highest levels of RBB for the LVT devices.

The relative amount performance decrease of SVT devices is slightly higher, and the relative level of leakage reduction is slightly lower, than that of the LVT devices. In many cases, however, the tradeoff between performance and power savings is still advantageous even at higher levels of RBB. Although it may be considered ideal in certain implementations to apply a medium level of RBB to the SVT devices, it has been determined that the performance and power savings tradeoff is still advantageous with higher levels of RBB applied to the SVT devices.

The HVT devices, however, suffer substantial performance degradation, such as up to 15% or more, at high levels of RBB, with very low levels of leakage reduction. In this manner, the higher levels of RBB application to the HVT devices is generally disadvantageous, so that it is desired to reduce or otherwise minimize the application of RBB for HVT. A fine grain voltage scaling as described herein attempts to optimize application of RBB within a common substrate or "sea of gates" by applying greater levels of RBB to groups or clusters of LVT and SVT devices and by applying lower levels of RBB to groups or clusters of HVT devices.

The HVT devices should receive the lowest RBB level, the SVT devices should receive a medium RBB level, and the LVT devices should receive the highest RBB level. As indicated by table 200. Exemplary RBB offset voltage levels for the HVT, SVT and LVT devices are shown as 100 mV, 200 mV and 300 mV, respectively, so that the HVT devices receive the lowest RBB level, the SVT devices receive a medium RBB level, and the LVT devices receive the highest RBB level in accordance with the tradeoff between performance and power savings. The particular RBB offset voltage levels listed are based roughly on the corresponding VT levels of the devices. The selected RBB offset voltage levels are based on predetermined discrete offset voltage levels that may be programmed with a corresponding digital value.

In one embodiment, a 2-bit control value may be used to program up to 4 RBB offset voltage levels, such as 100 mV, 200 mV, 300 mV and 400 mV. A 2-bit control value may be suitable for many applications. A 2-bit control value may also be used for 3 different offset voltage levels, such as 100 mV, 200 mV, and 300 mV or the like. In various configurations, the control value may include additional bits for higher granularity of RBB offset voltage control to program a higher number of discrete offset voltage levels. For example, 3 bits may be used to program between 100 mV and 400 mV in 50 mv increments, or 100 mV, 150 mV, 200 mV, 250 mV, 300 mV, 350 mV and 400 mV. It is appreciated that any suitable voltage range and any suitable number of bits may be used as the control value to program the NCPs to any desired level of discrete offset voltage granularity of the RBB offset voltage levels. The control values are configured or programmed within the NCP configuration block 120 for configuring or programming each of the NCPs 114-118.

Figure 3:
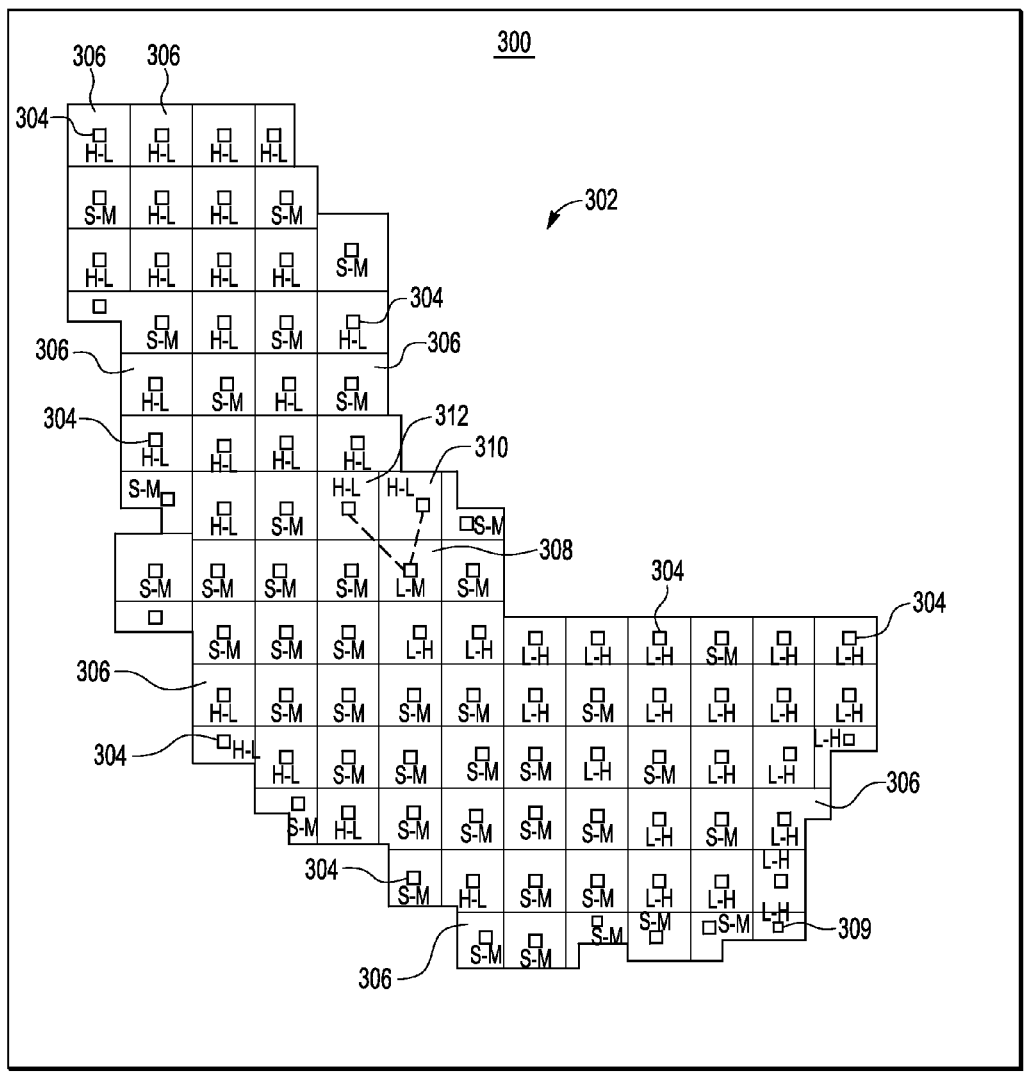
FIG. 3 is a figurative diagram of a chip or integrated circuit (IC) including multiple NCPs distributed within a common substrate area which is subdivided based on locales served by each of the NCPs.

FIG. 3 is a figurative diagram of a chip or integrated circuit (IC) 300 including multiple NCPs 304 distributed within a common substrate area 302 which is subdivided based on locales served by each of the NCPs 304. The gates and devices are not shown but are distributed along the substrate as shown in FIG. 12. The term "common" as used for the common substrate area 302 refers to the fact that the substrate within the area is electrically common to the HVT, SVT and LVT devices electrically coupled thereto via corresponding well ties or the like, such as the substrate layers 104 or 106. The common substrate of the area 302 may be electrically isolated from remaining portions of the IC 300, such as using guard rings or the like.

In one embodiment, the NCPs 304 are placed first and distributed to provide RBB service throughout the within the common substrate area 302 before any gates are placed. Then the gates and devices of the particular design are placed within the common substrate area 302 forming a sea of gates. Each NCP 304 is configured in substantially the same manner as the NCPs 114-118 previously described. The substrate configuration 101 may be viewed as a side-view of a portion of the common substrate area 302 having a common deep N-well substrate layer (e.g., 104 N-well substrate layer) and a common P-well substrate layer (e.g., isolated P-well substrate layer 106). In a similar manner as shown in FIG. 1 for the substrate configuration 101, each NCP 304 is connected to the common P-well substrate layer via a corresponding well tie 112. Furthermore, each NCP 304 is physically sized to generate a corresponding level of current to cover the gates and devices located within a corresponding locale 306 of the common substrate area 302. Each locale 306 is outlined with a dotted line and shown having a generally square-shape or rectangular-shape. It is appreciated that each locale 306 may alternatively be considered to have a circular-shape with a radial range of influence. The NCPs 304 are separated by distances determined according to a differential bias spacing based on their relative strengths.

Figure 4:
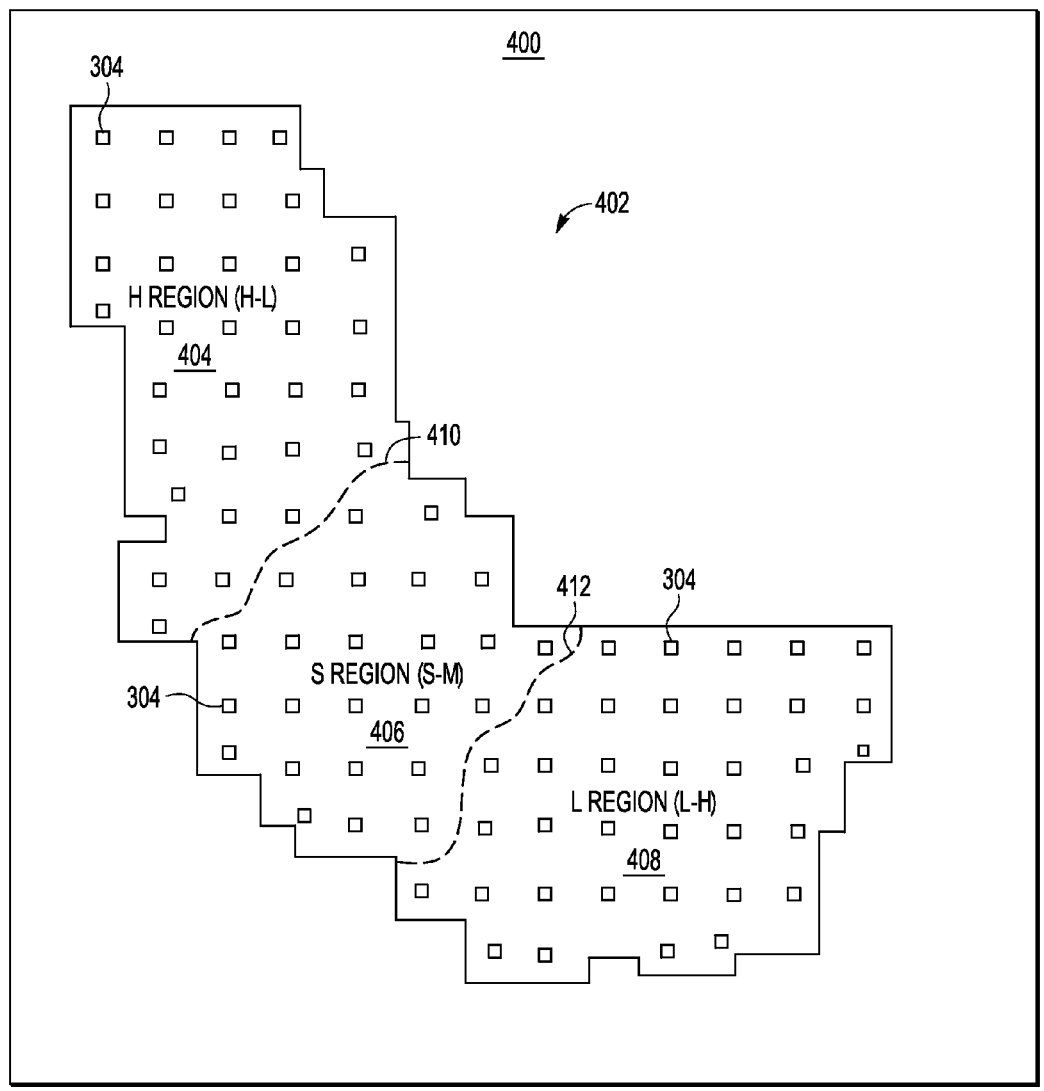
FIG. 4 is a figurative diagram of a chip or IC including multiple NCPs distributed within a common substrate area which is subdivided into regions.
Figure 5:
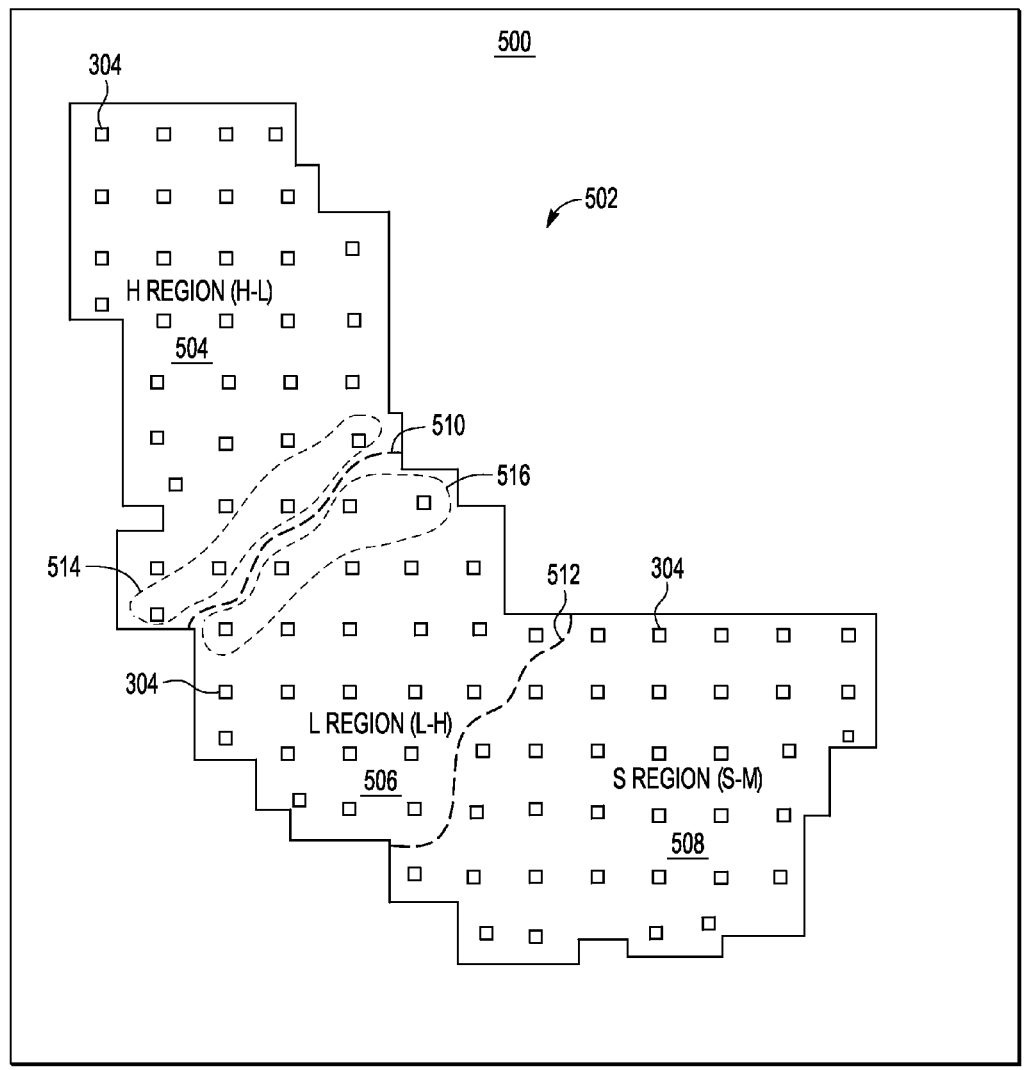
FIG. 5 is a figurative diagram of a chip or IC including multiple NCPs distributed within a common substrate area which is subdivided into regions and in which programming is adjusted to minimize current gradients.

A physically larger NCP produces more current and thus may cover a larger area, whereas a smaller NCP may be used to cover a smaller area. The square symbols shown in FIGS. 3-5 representing the NCPs 304 are not drawn to scale and are only shown for purposed of illustration. In one embodiment according to 40 nm technology, a physically large NCP 304 generates approximately 1 mA of current sufficient to roughly cover a locale of about 1,000×1,000 squares (or microns) which roughly services approximately 1 million devices or gates. A medium-sized NCP 304 generates approximately 0.5 mA of current to roughly cover a locale of 700×700 squares which roughly services approximately 500,000 devices or gates. A physically small NCP 304 generates approximately 0.25 mA of current to roughly cover a locale of 500×500 squares which roughly services approximately 250,000 devices or gates. Alternative configurations may be implemented for the given technology. Also, these configurations are illustrative only, in which alternative technologies may have different sizes and strengths.

A smaller NCP may be used to service a correspondingly smaller area or locale. Although not drawn to any particular scale, an NCP 309 covers a smaller area and may thus be sized accordingly. It is noted, however, that analog implementations of the NCPs 304 have an associated overhead such that a smaller NCP does not necessarily scale in size for any given technology. In general, a medium sized NCP covers about half the number of gates and area as a large NCP, but is larger than half the size of the large NCP. Similarly, a small NCP covers about half the number of gates and area as a medium sized NCP, but is larger than half the size of the medium sized NCP. In this manner, a large NCP is the most efficient in terms of the amount of coverage per unit size, and a medium sized NCP is more efficient than a small NCP. Nonetheless, a medium sized NCP or a small NCP may be used if a correspondingly smaller area needs to be covered in certain places. The NCPs 304 are positioned in an attempt to cover a maximum amount of area and are spaced apart from each other based on relative strength to minimize overlapping RBB application.

After gates and devices are placed, the relative population density of each device type is determined within the common substrate area 302. The population density may be determined according to any of several methods. Each device type is typically pulled from a corresponding standard library, which may be tracked by a placement script or the like. Population density may be determined for the entire area of the common substrate, or for each locale 306. It has been determined that devices of a certain type tend to group or cluster together in corresponding areas or regions, or the regions may be defined based on the clustering characteristics. The size, shape and location of each of the regions within the common substrate area 302 depends upon the particular implementation and the desired level of granularity.

In one embodiment, the population density may be based on a percentage of a particular type or combination of devices within a given area. For example, an area with 60% or more of LVT devices may be considered an L region (mostly LVT devices), an area with 60% or more of HVT devices may be considered an H region (mostly HVT devices), and otherwise the area may be considered an S region. In another embodiment, the LVT and SVT devices may be combined such that an area with 60% or more of LVT and SVT devices may be considered an L region, an area with 60% or more of HVT devices may be considered an H region, and otherwise the area may be considered an S region. It is possible that in some configurations there may not be S regions in which only H and L regions are defined.

It is understood that any given region designated as a certain region type may likely include a significant number of other device types. For example, an L region may include a significant number of H devices and vice-versa. Nonetheless, the regions are designated based on a relative population density of device types most common therein.

Once the relative population density of each region is determined, the NCPs included within that region are designated to be programmed accordingly. In general, each of the NCPs included within an L region are designated to be programmed with a high (H) RBB offset voltage level, each of the NCPs included within an H region are designated to be programmed with a low (L) RBB offset voltage level, and each of the NCPs included within an S region are designated to be programmed with a medium (M) RBB offset voltage level.

It is noted, however, that adjacent NCPs should not be programmed at a significant voltage differential since this may cause an undesired current gradient to be established between the NCPs. Thus, designated programming between adjacent NCPs with more than one discrete voltage level difference is adjusted to reduce substrate current between the adjacent NCPs. For example, a first NCP designated to be programmed at the H level adjacent an adjacent NCP designated to be programmed at the L level may cause a significant current gradient between the adjacent NCPs. Thus, the initial designated programming is adjusted to reduce significant voltage differential between adjacent NCPs. In general, the designated programming of either or both adjacent NCPs are adjusted to remove significant voltage differentials. In one embodiment, a voltage gradient of no more than one discrete voltage step may be allowed between adjacent NCPs.

Once the NCP designated voltage levels are determined and adjusted to remove significant voltage differentials, the NCPs are configured or programmed accordingly.

In the embodiment illustrated in FIG. 3, a device population density is determined for each of the locales 306 in which each locale is considered a region. Each locale 306 is designated with an H for a high population of HVT type devices, with an L for a high population of LVT type devices, or otherwise with an S for either a high concentration of SVT devices or a mixture of the different types of devices. The relative population may be based on a percentage of the corresponding types of devices or device combinations as previously described.

Once the population density of each locale 306 is determined, the designated RBB voltage level of the corresponding NCP 304 is determined. In general, the NCP 304 of each locale 306 designated with an H is programmed at a low or L offset voltage level, shown as "H–L", the NCP 304 of each locale 306 designated with an L is programmed at a high or H offset voltage level, shown as "L–H", and the NCP 304 of each locale 306 designated with an S is programmed at a medium or M offset voltage level, shown as "S–M".

After the initial designated voltage levels are determined, adjustments are made to remove significant voltage differentials between adjacent NCPs 304. In one embodiment the voltage level designated for one NCP 304 is adjusted one or more discrete levels towards the designated configuration of the adjacent NCP. For example, an adjacent H/L pair is changed either to M/L (first changed from H to M) or H/M (second changed from L to M). Alternatively, the programming of both NCPs are adjusted towards each other by one or more discrete steps to reduce the voltage differential.

As shown in FIG. 3, a locale 308 has an L concentration, and two adjacent locales 310 and 312 each have an H concentration. The NCP 304 of the locale 308 may be configured at a high H voltage offset level (L–H) and the NCP 304 of each of the locales 310 and 312 may each be programmed at the low L offset voltage level (H–L). Such configuration, however, would result in a significant current gradient between locale 308 and each of the locales 310 and 312 as indicated by dashed lines. Instead, the NCP 304 of the locale 308 is configured with a medium M offset voltage level (L–M) to reduce the voltage differential between the locales.

FIG. 3 illustrates adjustment of the NCP 304 of the locales 308 from an initial configuration designation of H to an adjusted configuration level of M. Although only one such voltage differential conflict is shown in FIG. 3, it is understood that any number of voltage differential conflicts may result from an initial configuration designation, in which adjustments are made to avoid any such significant voltage differentials. Alternatively, the programming of the locales 310 and 312 may instead be adjusted form L to M.

It is further noted that table 200 illustrates a low RBB offset voltage level at 100 mV and a medium RBB offset voltage level at 200 mV. The discrete programming levels may include other intermediate offset voltage levels depending upon the resolution of programming and/or the high RBB level may be modified as well. Thus, in addition to reducing offset voltage differentials between H and L locales, further adjustments may be made to reduce offset voltage differential between each locale 306 with an S concentration and any adjacent locales with an H concentration. Although not shown, the NCPs 304 of the adjacent locales with an S concentration may be tweaked to further reduce offset voltage differential between H and S locales.

FIG. 4 is a figurative diagram of a chip or IC 400 including multiple NCPs 304 distributed within a common substrate area 402 which is subdivided into regions. Again, the actual gates and devices are not shown. In one embodiment, the NCPs 304 are placed first and distributed to provide RBB service throughout the common substrate area 402 before any gates are placed. Then the gates and devices of the particular design are placed within the common substrate area 402 forming a sea of gates. Each NCP 304 is configured in substantially the same manner as the NCPs 114-118 previously described. Each NCP 304 is sized to serve a corresponding locale in a similar manner as previously described for the configuration shown in FIG. 3.

In this case, the population density determination reveals three different regions 404, 406 and 408, in which each region includes multiple locales. In this case, a first border 410 denoted with a dashed line separates regions 404 and 406, and a second border 412 denoted with another dashed line separates regions 406 and 408. The region 404 is predominately HVT devices and thus designated as an H region, and the region 408 is predominately LVT devices (or a combination of LVT and SVT devices) and thus designated as an L region. The intermediate region 406 does not predominately include H or L devices and thus is designated as an S region. The NCPs 304 within the region 404 are designated to be programmed with an L RBB offset voltage level, shown as H–L, the NCPs 304 within the region 406 are designated to be programmed with an M RBB offset voltage level, shown as S–M, and the NCPs 304 within the region 408 are designated to be programmed with an H RBB offset voltage level, shown as L–H. In this case, since the H and L regions are separated by an S region and the NCPs 304 are programmed accordingly, the designated programming does not need further adjustment and the NCPs 304 are programmed accordingly.

FIG. 5 is a figurative diagram of a chip or IC 500 including multiple NCPs 304 distributed within a common substrate area 502 which is subdivided into regions and in which programming is adjusted to minimize current gradients. Again, the actual gates and devices are not shown. In one embodiment, the NCPs 304 are placed first and distributed to provide RBB service throughout the common substrate area 502 before any gates are placed. Then the gates and devices of the particular design are placed within the common substrate area 502 forming a sea of gates. Each NCP 304 is configured in substantially the same manner as the NCPs 114-118 previously described. Each NCP 304 is sized to serve a corresponding locale in a similar manner as previously described for the configurations shown in FIGS. 3 and 4.

In this case, the population density determination reveals three different regions 504, 506 and 508 separated by borders 510 and 512 in a similar manner as for the IC 400. In this case, the region 504 is predominately HVT devices and thus designated as an H region and the region 506 is predominately LVT devices (or a combination of LVT and SVT devices) and thus designated as an L region. The last region 508 is neither H or L and thus is designated as an S region. The NCPs 304 within the region 504 are initially designated to be programmed with an L RBB offset voltage level (H–L), the NCPs 304 within the region 506 are initially designated to be programmed with an H RBB offset voltage level (L–H), and the NCPs 304 within the region 508 are designated to be programmed with an M RBB offset voltage level (S–M).

In this case, since the H and L regions are not separated by an S region but instead are located adjacent each other across a common border 510. The NCPs 304 within the region 504 located adjacent the border 510, shown within dotted lines at 514, are initially designated to be programmed at an L RBB offset voltage level whereas the NCPs 304 within the region 506 located adjacent the border 510, shown within dotted lines at 516, are initially designated to be programmed at an H RBB offset voltage level. The initial designated programming, therefore, would otherwise result in significant voltage differentials between adjacent NCPs 304 across the border.

In one embodiment, the NCPs 304 shown at 514 may be re-designated to be programmed at an M offset voltage level so that adjacent NCPs are not programmed with a significant voltage differential. Alternatively, the NCPs 304 shown at 516 may be re-designated to be programmed at an M offset voltage level so that adjacent NCPs are not programmed with a significant voltage differential. Alternatively, the NCPs 304 shown at 514 and 516 may both be re-designated to be programmed at an M offset voltage level so that adjacent NCPs are not programmed with a significant voltage differential. Any of these solutions would remove significant voltage differential. The last option of re-designated all of the border devices has an advantage of providing a more gradual voltage gradient between the regions 504 and 506.

After the initial designated programming is adjusted to remove significant voltage differentials, the NCPs 304 are programmed or otherwise configured accordingly.

Figure 6:
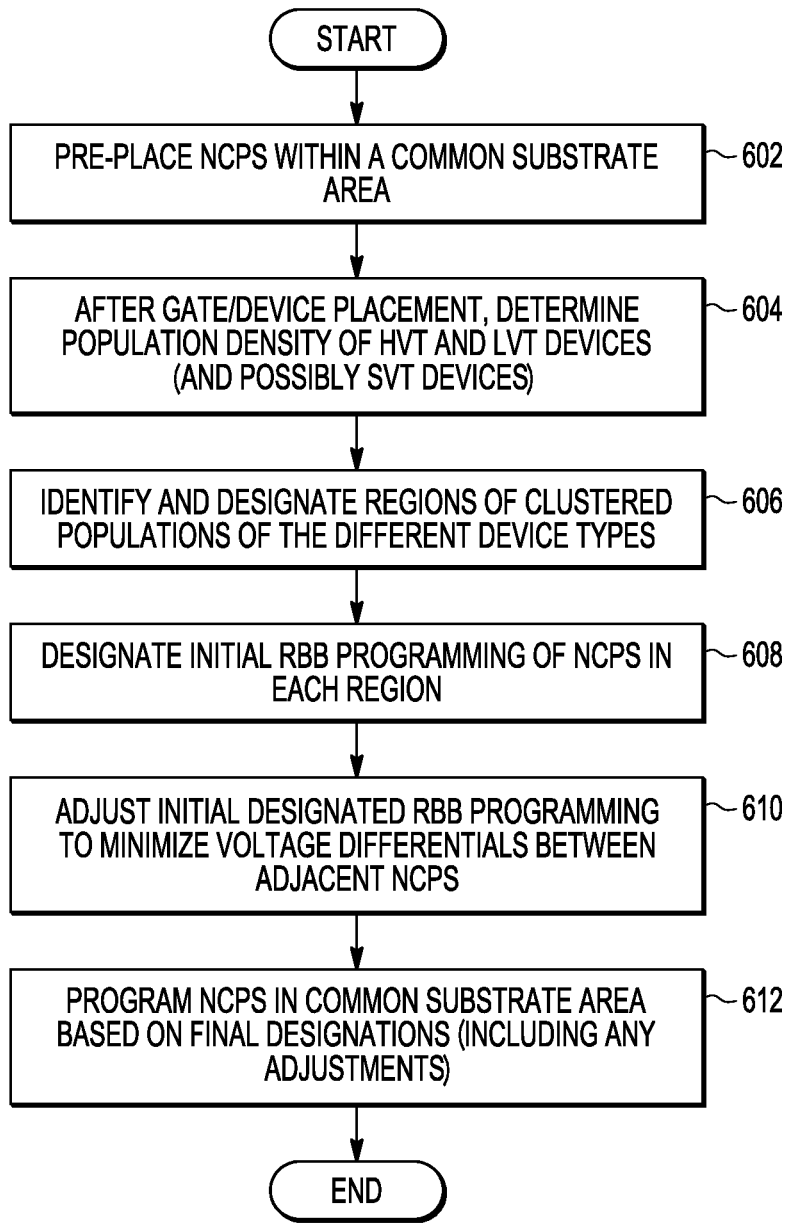
FIG. 6 is a flowchart diagram illustrating a process in accordance with fine grain voltage scaling of RBB.

FIG. 6 is a flowchart diagram illustrating a process in accordance with fine grain voltage scaling of RBB as described herein, which may be performed during fabrication of a chip or IC. At a first block 602, NCPs are pre-placed across the area of a common substrate of the IC. At next block 604, after gate and device placement within the common substrate area, the population density of each of at least the HVT and LVT devices is determined. In one embodiment, the region designations may be made without considering the SVT population density. In another embodiment, the population density of the SVT devices are separately determined. In another embodiment, the LVT and SVT devices are combined for determining a combined population density.

At next block 606, regions of clustered populations of the different device types are identified and further designated with region type according to the population densities. The size and shape of each of the regions depends upon the corresponding population density. The regions may be defined for each locale covered by each NCP. However, for larger groupings of particular device types, larger regions may be defined based on the population density. The regions need not be uniform in size. Any given region may include any number of locales. One region may include only one locale whereas another region within the same common substrate area may include hundreds of locales or more.

At next block 608, the NCPs within each region are initially designated with RBB programming based on the population density within the designated region. Generally, regions with predominately LVT devices receive the highest level of RBB programming and regions with predominately HVT devices receive the lowest level of RBB programming. Any remaining regions may be designated to receive the medium or intermediate programming. At next block 610, the initial programming designations are adjusted to minimize voltage differential between adjacent NCPs. In one embodiment, this includes ensuring only one discrete programming voltage step between adjacent NCPs. Finally, at block 612, the NCPs of each region are programmed or otherwise configured based on the final programming designations including any adjustments made at block 610.

The use of NCPs to program the relative RBB offset voltage level according to fine grain voltage scaling based on device type population is advantageous to reduce the performance decrease of HVT devices when applying RBB to reduce overall substrate leakage and to reduce power consumption. RBB application is particularly advantageous for a batch of semiconductor chips which are relatively fast and leaky in which power consumption is substantially reduced at the cost of slightly performance degradation.

On the other hand, another batch of semiconductor chips may be relatively slow and less leaky in which it is desired to increase performance of the devices and thus the overall IC. In that case, forward back biasing (FBB) may be advantageous to improve the performance of the IC at the cost of increasing leakage and power consumption.

Figures 7, 8:
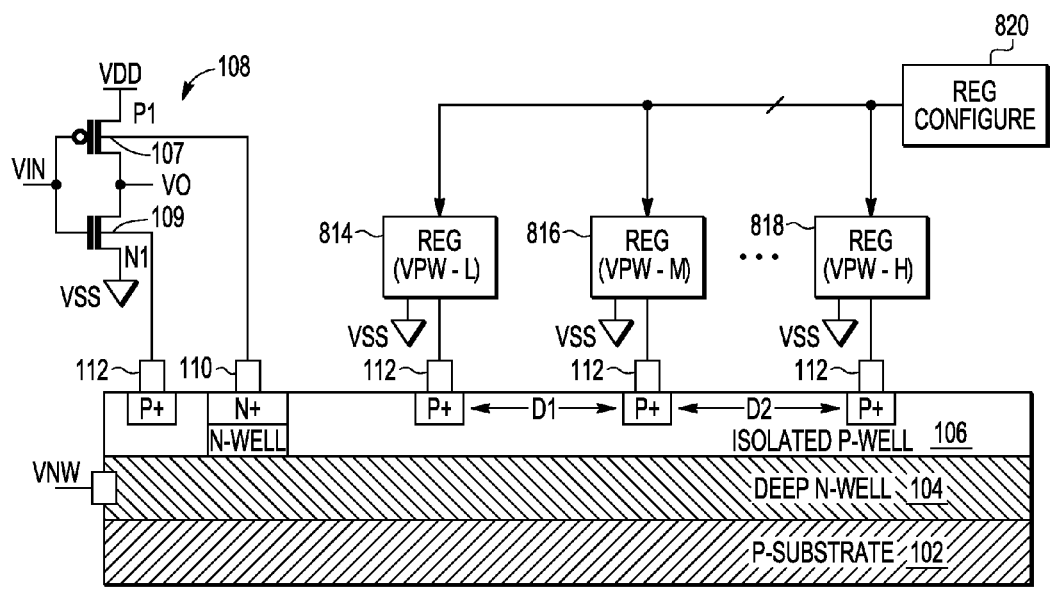
FIG. 7 is a table listing the corresponding VT, relative characteristics, and possible FBB offset voltage level of each of the different device types HVT, SVT and LVT, respectively.
FIG. 8 is a simplified schematic and figurative diagram illustrating a physical substrate configuration, which may include multiple substrate layers, logic devices such as logic gates and the like, substrate well ties, and programmable regulators distributed along the substrate for applying FBB.

FIG. 7 is a table 700 similar to table 200 listing the corresponding VT, relative characteristics, and possible FBB offset voltage level of each of the different device types HVT, SVT and LVT, respectively. The relative speed and the relative amount of leakage are the same for each of the devices. In this case, however, the relative characteristics include a relative performance increase with FBB, relative leakage increase with application of FBB, and relative FBB level to be applied. The relative FBB level is selected to increase performance and minimize leakage increase as further described herein. The FBB offset voltage level corresponds with the relative FBB level and is an offset voltage relative to the voltage level of VSS, which is the voltage level of the sources of the devices. The VT values and FBB offset voltage level are again listed in mV and the relative characteristics are each listed as one of low (L), medium (M) and high (H).

As shown in table 700, the impact on performance with FBB is similar to the RBB case in which the increase of performance is high (H) for HVT devices, medium (M) for SVT devices, and low (L) for LVT devices. The relative leakage increase with FBB is also similar to the RBB case, in which it is low (L) for HVT devices, medium (M) for SVT devices, and high (H) for LVT devices. In this case, since it is desired to increase performance while minimizing impact of leakage, the relative FBB to achieve this goal is high (H) for HVT devices, medium (M) for SVT devices, and low (L) for LVT devices. The relative FBB is effectively opposite that for the relative RBB. The possible FBB offset voltage level of each of the different device types is effectively reversed as well, shown as 300 mV for HVT devices, 200 mV for SVT devices and 100 mV for LVT devices.

FIG. 8 is a simplified schematic and figurative diagram illustrating a physical substrate configuration 801, which may include multiple substrate layers, logic devices such as logic gates and the like, substrate well ties, and programmable regulators (REG) distributed along the substrate for applying FBB. The substrate configuration 801 is substantially similar to the substrate configuration 101, except that the NCPs 114-118 are replaced by voltage regulators 814, 816, . . . , 818 distributed across the area of the P-well substrate layer 106 in similar manner. The distances D1 and D2 are similar according to a differential bias spacing. Each regulator 814-818 is connected to the P-well substrate layer 106 via a corresponding one of multiple well ties 112 distributed across the P-well substrate layer 106 in similar manner. Each regulator 814-818 is also coupled to VSS and programs an offset voltage relative to VSS.

In this case, the deep N-well substrate layer 104 is charged to a VNW bias voltage level which is less than VDD for FBB, and the regulators 814-818 are used to charge the P-well substrate layer 106 to a VPW bias voltage level which is greater than VSS for FBB. The relative programming of the regulators 814-818 are reversed as compared to the NCPs 114-118 for purposes of illustration. In this case, the regulator 814 is programmed with a VPW at a low (L) FBB offset voltage level most suitable for LVT devices, the regulator 816 is programmed with a VPW at a medium (M) FBB offset voltage level most suitable for SVT devices, and the regulator 818 is programmed with a VPW at a high (H) FBB offset voltage level most suitable for HVT devices.

A REG configuration block 820 is shown for programming each of the regulators 814-818 to a selected one of the multiple discrete offset voltage levels. The REG configuration block 820 may be configured in any suitable manner, such as a memory device storing programmed values each corresponding to one of the discrete offset voltage levels. In another embodiment, the REG configuration block 820 includes multiple fuses which are blown during fabrication to set the discrete offset voltage level for each of the regulators 814-818. A fuse configuration is a static configuration in which the regulators 814-818 are generally not further programmed during operation.

Figure 9:
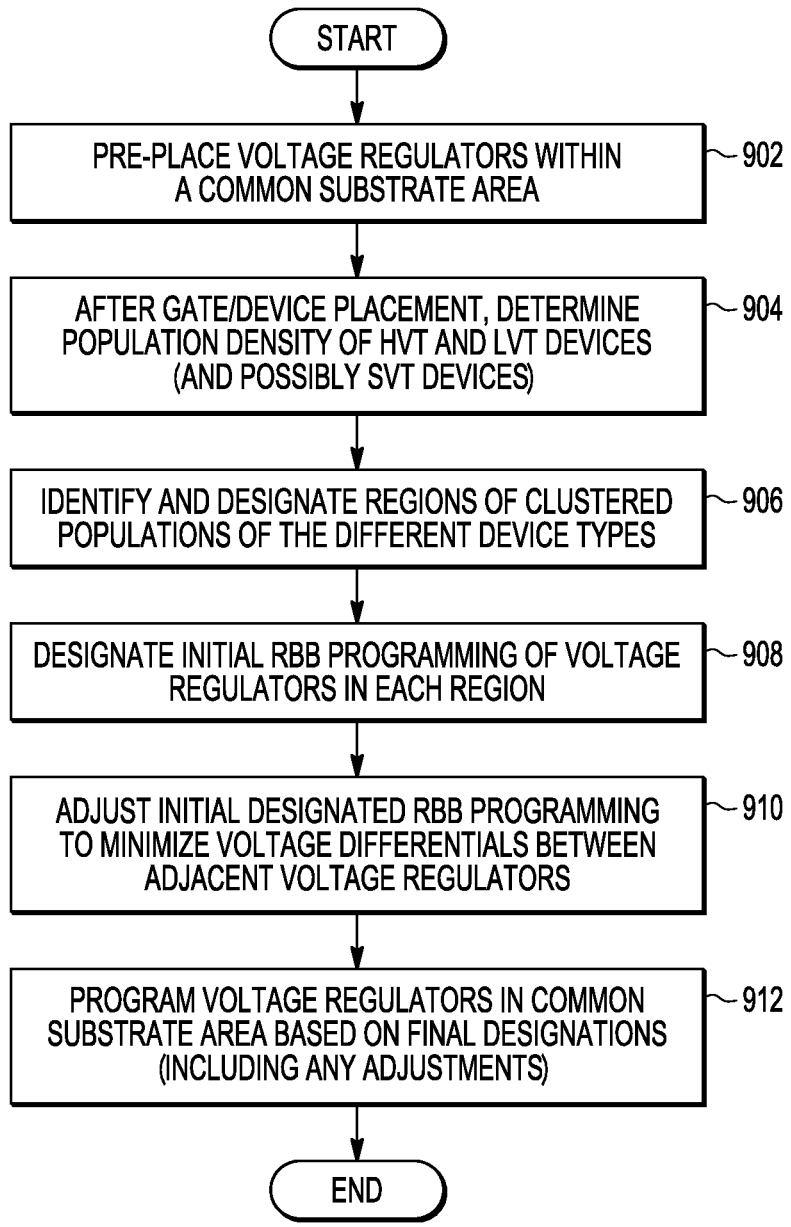
FIG. 9 is a flowchart diagram illustrating a process in accordance with fine grain voltage scaling of FBB.

FIG. 9 is a flowchart diagram illustrating a process in accordance with fine grain voltage scaling of FBB as described herein. The flowchart is similar to that of FIG. 6 except modified for FBB programming. At a first block 902, the voltage regulators are pre-placed within a common substrate area of a chip or IC. Although not specifically shown, the voltage regulators are distributed in a similar manner as the NCPs as shown in FIGS. 3-5.

At next block 904, after gate and device placement within the common substrate area, the population density of at least the HVT and LVT devices is determined. The population density of the SVT devices may be separately considered or combined with the LVT device types as previously described. At next block 906, regions of clustered populations of the different device types are identified and further designated with region type according to the population densities. As with RBB, the size and shape of each of the regions depends upon the corresponding population density. The regions may be defined for each locale covered by each voltage regulator. However, for larger groupings of particular device types, larger regions may be defined based on the population density. The regions need not be uniform in size. Any given region may include any number of locales. One region may include only one locale whereas another region within the same common substrate area may include hundreds of locales or more.

At next block 908, the voltage regulators within each region are initially designated with FBB programming based one the population density within the designated region. Generally, regions with predominately LVT devices receive the lowest level of FBB programming and regions with predominately HVT devices receive the highest level of FBB programming (opposite of the initial designations as RBB). Any remaining regions may be designated to receive the medium or intermediate programming. At next block 910, the initial programming designations are adjusted to minimize voltage differential between adjacent voltage regulators. In one embodiment, this includes ensuring only one discrete programming voltage step between adjacent voltage regulators. Finally, at block 912, the voltage regulators of each region are programmed based on the final programming designations including any adjustments made at block 910.

The use of voltage regulators to program the relative FBB level according to fine grain voltage scaling based on device type population is advantageous to increase the performance of HVT devices when applying FBB while minimizing impact of increased substrate leakage and power consumption. As described above, RBB application is particularly advantageous for a batch of semiconductor chips which are relatively fast and leaky in which power consumption is substantially reduced at the cost of slightly performance degradation, whereas FBB may be advantageous for a batch of semiconductor chips which are relatively slow and less leaky to improve the performance of the IC at the cost of increasing leakage and power consumption.

It is appreciated, however, that it may not be known beforehand which batch will be slower and which will be faster. It may be desired to provide an optimal level of programming to achieve either goal depending upon the results of fabrication. Furthermore, for a given chip or design, it may be advantageous to allow programming during operation according to any one of multiple operating modes. For example, it may be advantageous to apply RBB during low power modes of operation (e.g., sleep, standby, etc.), while applying FBB during normal or high performance modes of operation.

Figure 10:
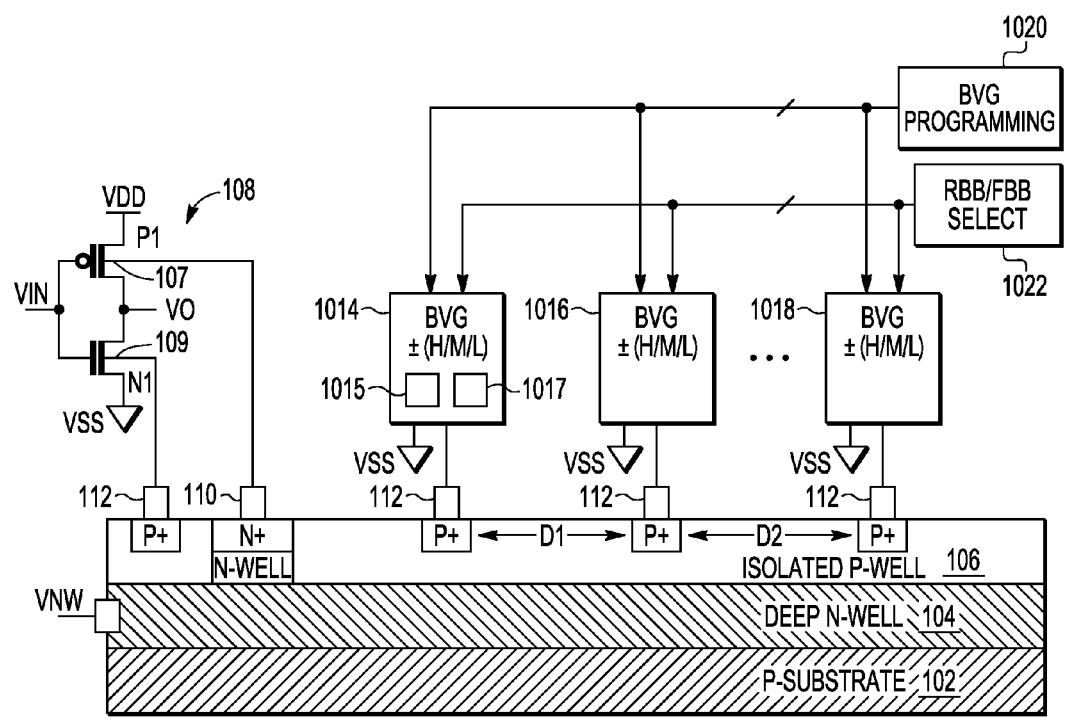
FIG. 10 is a simplified schematic and figurative diagram illustrating a physical substrate configuration, which may include multiple substrate layers, logic devices such as logic gates and the like, substrate well ties, and programmable bias voltage generators (BVGs) distributed along the substrate for applying either RBB or FBB for static or dynamic configurations.

FIG. 10 is a simplified schematic and figurative diagram illustrating a physical substrate configuration 1001, which may include multiple substrate layers, logic devices such as logic gates and the like, substrate well ties, and programmable bias voltage generators (BVGs) distributed along the substrate for applying either RBB or FBB for static or dynamic configurations. The substrate configuration 1001 is substantially similar to the substrate configurations 801 and 101, except that the NCPs 114-118 or voltage regulators 814-818 are replaced by BVGs 1014, 1016, . . . , 1018 distributed across the area of the P-well substrate layer 106 in similar manner. The distances D1 and D2 are similar according to a differential bias spacing. Each BVG 1014-1018 is connected to the P-well substrate layer 106 via a corresponding one of multiple well ties 112 distributed across the P-well substrate layer 106 in similar manner. Each BVG 1014-1018 is also coupled to VSS and programs an offset voltage relative to VSS.

In this case, the deep N-well substrate layer 104 is charged to a VNW bias voltage level which is greater than VDD for RBB and less than VDD for FBB. The BVGs 1014-1018 are used to charge the P-well substrate layer 106 to a VPW bias voltage level which is less than VSS for RBB and greater than VSS for FBB. The BVGs have a higher level of programming in which each may be programmed at any one of discrete voltage levels both above or below VSS to achieve either RBB or FBB.

In one embodiment, as illustrated by the BVG 1014, each BVG may include an NCP 1015 for RBB programming and a voltage regulator 1017 for FBB programming. The programming of the BVGs 1014-1018 may be static and determined at time of manufacture based on whether RBB or FBB is to applied for the particular chip, such as by using fuses or the like. Alternatively, the BVGs 1014-1018 remain programmable during operation in which it is desired to program the BVGs 1014-1018 dynamically to apply RBB or FBB, such as based on the mode of operation. Dynamic programming may be achieved using a memory device. For example, the BVGs 1014-1018 may be programmed to apply RBB during low power modes or the apply FBB during normal or high performance operating modes.

A BVG programming block 1020 is shown for programming each of the BVGs 1014-1018 to a selected one of the multiple discrete offset voltage levels. The BVG programming block 1020 may be configured in any suitable manner, such as a memory device storing programmed back bias values each corresponding to one of the discrete offset voltage levels. In another embodiment, the BVG programming block 1020 includes multiple fuses which are blown during fabrication to set the discrete offset voltage level for each of the BVGs 1014-1018. A fuse configuration is a static configuration in which the BVGs 1014-1018 are generally not further programmed during operation.

An RBB/FBB select block 1022 is shown for programming each of the BVGs 1014-1018 according to a selected one of RBB or FBB. In one embodiment, for example, the RBB/FBB select block 1022 enables corresponding NCPs within the BVGs 1014-1018 for application of RBB, or enables corresponding voltage regulators with the BVGs 1014-1018 for application of FBB. The RBB/FBB select block 1022 may be configured in any suitable manner, such as a memory device storing programmed values each corresponding to one of the discrete offset voltage levels. In another embodiment, the RBB/FBB select block 1022 includes multiple fuses which are blown during fabrication to set the discrete offset voltage level for each of the BVGs 1014-1018. A fuse configuration is a static configuration in which the BVGs 1014-1018 are generally not further programmed during operation.

As an example, for a fast and leaky IC, the RBB/FBB select block 1022 may be programmed to enable RBB devices to provide RBB offset voltage levels (e.g., enable NCPs or the like), and the BVG programming block 1020 is configured to program the specific RBB offset voltage level for each of the BVGs 1014-1018. This may be a static configuration, such as using fuses or the like, to reduce power consumption of the IC. For a relatively slow IC, the RBB/FBB select block 1022 may be programmed to enable FBB devices to provide FBB offset voltage levels (e.g., enable voltage regulators or the like), and the BVG programming block 1020 is configured to program the specific FBB offset voltage level for each of the BVGs 1014-1018. This may be a static configuration, such as using fuses or the like, to improve performance of the IC.

In an alternative configuration, the RBB/FBB select block 1022 is a dynamic memory device or the like in which RBB or FBB may be enabled on the fly or dynamically during operation. For example, RBB devices are enabled to apply RBB during low power modes or the like, and FBB devices are enabled to apply FBB during normal or high performance modes of operation. The BVG programming block 1020 also includes a static memory for storing corresponding RBB and FBB offset voltage levels, such as a lookup table or the like. The RBB control values are output when RBB is selected to program the BVGs 1014-1018 to apply the RBB offset voltage levels, or the FBB control values are output when FBB is selected to program the BVGs 1014-1018 to apply the FBB offset voltage levels. Dynamic programming provides increased flexibility for application of back biasing during operation.

Figure 11:
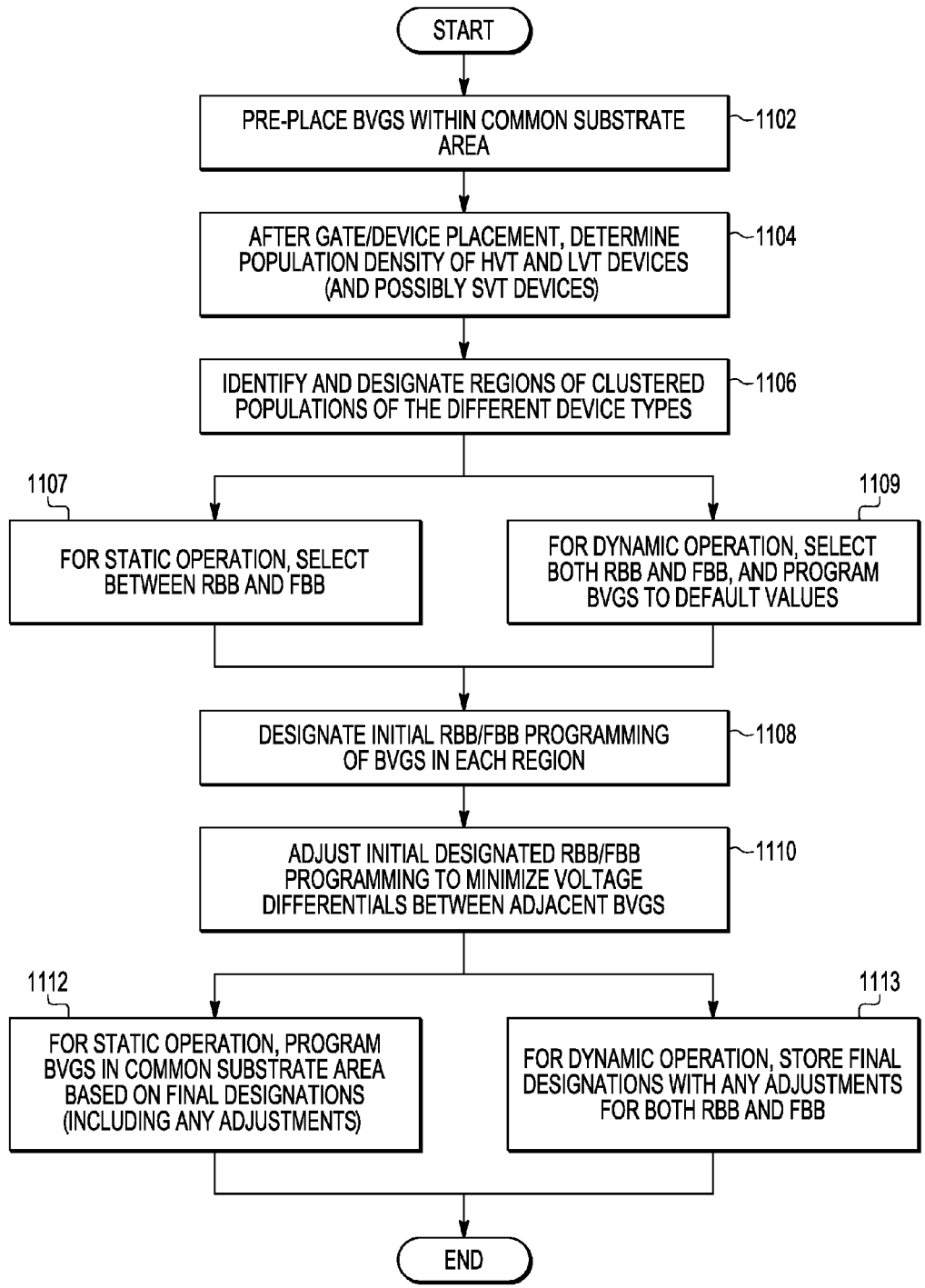
FIG. 11 is a flowchart diagram illustrating a process in accordance with fine grain voltage scaling of RBB and/or FBB for static or dynamic configurations using BVGs as described herein.

FIG. 11 is a flowchart diagram illustrating a process in accordance with fine grain voltage scaling of RBB and/or FBB for static or dynamic configurations using BVGs, such as the BVGs 1014-1018. At a first block 1102, the BVGs are pre-placed within a common substrate area of a chip or IC. Although not specifically shown, the BVGs are distributed in a similar manner as the NCPs as shown in FIGS. 3-5. At next block 1104, after gate and device placement within the common substrate area, the population densities of the HVT and SVT devices, and possibly the LVT devices, are determined as previously described. As with the RBB and FBB configurations, the size and shape of each of the regions depends upon the corresponding population density. The regions may be defined for each locale covered by each BVG in a similar manner as described above for both the NCPs and voltage regulators.

Operation advances to block 1107 for a static configuration in which the BVGs are programmed during fabrication, or to block 1109 for a dynamic configuration in which the BVGs may be dynamically programmed during operation. At block 1107 for static operation, it is determined whether the IC is suitable for RBB or FBB and selection is made accordingly to one of RBB or FBB. The RBB/FBB select block 1022 is programmed accordingly. At block 1109 for dynamic operation, both RBB and FBB are selected because both may be employed during operation depending upon the operating mode. Also, the BVGs may be programmed to default values, such as to drive the P-well substrate layer 106 to the same voltage level as VSS.

Operation then advances to block 1108, in which the BVGs within each region are initially designated with either RBB or FBB (static) programming, or both RBB and FBB (dynamic) programming based one the population density within the designated region. At next block 1110, the initial programming designations are adjusted to minimize voltage differential between adjacent BVGs. In one embodiment, this includes ensuring only one discrete programming voltage step between adjacent BVGs. For static operation, operation advances to block 1112 in which the BVGs of each region are programmed based on the final programming designations including any adjustments made at block 1110. The BVG programming block 1020 is programmed accordingly.

For the dynamic operation, the final control values for RBB and FBB voltage offsets with any adjustments are stored in a memory within the BVG programming block 1020. The memory may be configured in any suitable manner, such as a lookup table for the like. During operation of the IC, when RBB is indicated, such as during a low power mode to conserve power, the programmed RBB values are retrieved and the BVGs are programmed accordingly. Likewise, when FBB is indicated, such as during a normal or high performance mode, the programmed FBB values are retrieved and the BVGs are programmed accordingly.

The present disclosure has described fine grain voltage scaling of back biasing of the VPW voltage as applied to the P-well substrate layer 106. Multiple voltage control devices, such as NCPs, voltage regulators, or BVGs or the like, which may be configurable or programmable, are distributed within a common substrate area of the P-well substrate layer 106 and each is programmed with a corresponding one of multiple back bias offset voltage levels (forward or reverse) based at least on the relative population density of high threshold voltage devices and low threshold voltage devices within locales or regions of the common area. The population densities of the SVT devices may be separately considered or combined as previously described. The multiple back bias offset voltage levels are described as offset voltages relative to VSS which is the voltage level of the source terminals of the devices coupled to VSS.

Although not specifically shown, the principles of fine grain voltage scaling of back biasing is equally applicable to programming the VNW voltage as applied to the deep N-well substrate layer 104. In this case, multiple voltage control devices, such as voltage regulators, or BVGs or the like, are distributed within a common substrate area of the deep N-well substrate layer 104 and each is programmed with a corresponding one of multiple back bias offset voltage levels (forward or reverse) based on the relative population density of high threshold voltage devices and low threshold voltage devices (and possibly standard threshold voltage devices) within locales or regions of the common substrate area. The multiple back bias offset voltage levels are offset voltages relative to VDD which is the voltage level of the source terminals of the devices coupled to VDD. In one embodiment, VDD is approximately 1.2V, in which each voltage device is programmed to voltage levels of 1.3V, 1.4V or 1.5V for RBB or 1.1V, 1.0V or 0.9V for FBB relative to VDD.

Although the invention is described herein with reference to specific embodiments, it is presented to enable one of ordinary skill in the art to make and use the present invention as provided within the context of a particular application and its requirements. Various modifications and changes can be made as apparent to those of ordinary skill in the art without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit, comprising:
   a substrate;
   a plurality of devices, each of said plurality of devices having a body connection electrically coupled to said substrate, wherein said plurality of devices includes at least one high threshold voltage device and at least one low threshold voltage device; and
   a plurality of voltage control devices distributed across said substrate to bias different locations of the same layer of the substrate at different bias voltages, respectively, wherein each of said plurality of voltage control devices has an output electrically coupled to said substrate and is configured to apply a back bias voltage to said substrate at one of a plurality of discrete offset voltage levels relative to a reference supply voltage level;
   wherein said plurality of discrete offset voltage levels includes a first offset voltage level for back biasing said at least one high threshold voltage device and a second offset voltage level for back biasing said at least one low threshold voltage device.

2. The integrated circuit of claim 1, wherein said plurality of discrete offset voltage levels includes a third offset voltage level which is between said first offset voltage and said second offset voltage level, and wherein said plurality of voltage control devices includes at least one voltage control device which is configured to apply a back bias voltage at said third offset voltage level.

3. The integrated circuit of claim 2, wherein said plurality of devices includes at least one standard threshold voltage device having a medium threshold voltage.

4. The integrated circuit of claim 1, wherein each of said plurality of voltage control devices comprises a negative charge pump, wherein said plurality of discrete offset voltage levels are reverse back bias voltage levels, wherein said first offset voltage level is less than said second offset voltage level.

5. The integrated circuit of claim 1, wherein each of said plurality of voltage control devices comprises a voltage regulator, wherein said plurality of discrete offset voltage levels are forward back bias voltage levels, wherein said first offset voltage level is less than said second offset voltage.

6. The integrated circuit of claim 1, wherein each of said plurality of voltage control devices is dynamically programmable during operation using a corresponding one of a plurality of stored back bias values.

7. The integrated circuit of claim 1, wherein said substrate is subdivided into a plurality of locales, wherein at least one of said plurality of voltage control devices is located within a corresponding one of said plurality of locales, and wherein said at least one of said plurality of voltage control devices is configured to apply a back bias voltage level based on a relative population of high threshold voltage devices and low threshold voltage devices located within said corresponding one of said plurality of locales.

8. The integrated circuit of claim 7, wherein said at least one of said plurality of voltage control devices is configured to apply a back bias voltage level based on a relative population of high threshold voltage devices, standard threshold voltage devices, and low threshold voltage devices located within said corresponding one of said plurality of locales.

9. The integrated circuit of claim 1, wherein said substrate is subdivided into a plurality of regions based on a relative population of high threshold voltage devices and low threshold voltage devices located within each of said plurality of regions, wherein said plurality of regions includes at least one region designated as a high threshold voltage region and at least one region designated as a low threshold voltage region, wherein at least one of said plurality of voltage control devices located within said high threshold voltage region is configured to apply a back bias voltage at said first offset voltage level, and wherein at least one of said plurality of voltage control devices located within said low threshold voltage region is configured to apply a back bias voltage at said second offset voltage level.

10. The integrated circuit of claim 9, wherein said plurality of discrete offset voltage levels includes a third offset voltage level which is between said first offset voltage and said second offset voltage level, wherein said plurality of regions includes at least one region designated as a medium threshold voltage region, and wherein at least one of said plurality of voltage control devices located within said medium threshold voltage region is configured to apply a back bias voltage at said third offset voltage level.

11. The integrated circuit of claim 1, wherein said plurality of discrete offset voltage levels includes at least three discrete offset voltage levels separated by a voltage differential in which said first and second voltage levels are separated by at least twice said voltage differential, and wherein adjacent ones of said plurality of voltage control devices are configured to apply back bias voltages which differ by no more than one voltage differential.

12. The integrated circuit of claim 1, further comprising a configuration block which is configured to apply control values for programming each of said plurality of voltage control devices at a selected one said plurality of discrete offset voltage levels.

13. The integrated circuit of claim 1, further comprising:
   a selection block that is configured to enable each of said plurality of voltage control devices for a selected one of forward back bias and reverse back bias;
   wherein each of said plurality of voltage control devices comprises a programmable bias voltage generator; and
   a configuration memory which stores a plurality of first control values for programming each of said plurality of voltage control devices to apply a selected one of a plurality of reverse back bias voltage levels, and which stores a plurality of second control values for programming each of said plurality of voltage control devices to apply a selected one of a plurality of forward back bias voltage levels.

* * * * *